United States Patent
Yun et al.

(10) Patent No.: US 10,141,353 B2
(45) Date of Patent: Nov. 27, 2018

(54) PASSIVE COMPONENTS IMPLEMENTED ON A PLURALITY OF STACKED INSULATORS

(71) Applicant: QUALCOMM Incorporated, San Diego, CA (US)

(72) Inventors: Changhan Hobie Yun, San Diego, CA (US); Daeik Daniel Kim, Del Mar, CA (US); Jonghae Kim, San Diego, CA (US); Mario Francisco Velez, San Diego, CA (US); Chengjie Zuo, San Diego, CA (US); David Francis Berdy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 235 days.

(21) Appl. No.: 15/161,152

(22) Filed: May 20, 2016

(65) Prior Publication Data

US 2017/0338255 A1    Nov. 23, 2017

(51) Int. Cl.
| | |
|---|---|
| *H01L 27/13* | (2006.01) |
| *H03H 7/01* | (2006.01) |
| *H01L 21/84* | (2006.01) |
| *H01L 49/02* | (2006.01) |
| H01L 23/498 | (2006.01) |
| H03H 1/00 | (2006.01) |

(52) U.S. Cl.
CPC .............. *H01L 27/13* (2013.01); *H01L 21/84* (2013.01); *H01L 28/10* (2013.01); *H01L 28/40* (2013.01); *H03H 7/0115* (2013.01); *H01L 23/49822* (2013.01); *H03H 2001/0085* (2013.01)

(58) Field of Classification Search
None
See application file for complete search history.

(56) References Cited

U.S. PATENT DOCUMENTS

| | | | |
|---|---|---|---|
| 4,687,540 | A | 8/1987 | Singhdeo et al. |
| 6,252,761 | B1 | 6/2001 | Branchevsky |
| (Continued) | | | |

FOREIGN PATENT DOCUMENTS

| | | |
|---|---|---|
| EP | 2079290 A2 | 7/2009 |
| WO | 2005084090 A1 | 9/2005 |
| WO | 2013024341 A1 | 2/2013 |

OTHER PUBLICATIONS

International Search Report and Written Opinion—PCT/US2017/028862—ISA/EPO—dated Jul. 31, 2017.

Primary Examiner — Michael Lebentritt
(74) Attorney, Agent, or Firm — Muncy, Geissler, Olds & Lowe, P.C.

(57) ABSTRACT

The present disclosure provides integrated circuit apparatuses and methods for manufacturing integrated circuit apparatuses. An integrated circuit apparatus may include a first insulator, the first insulator being substantially planar and having a first top surface and a first bottom surface opposite the first top surface, a first conductor disposed on the first insulator, a second insulator, the second insulator being substantially planar and having a second top surface and a second bottom surface opposite the second top surface, a second conductor disposed on the second insulator, and a dielectric layer disposed between the first bottom conductor of the first insulator and the second top conductor of the second insulator.

18 Claims, 6 Drawing Sheets

(56) References Cited

U.S. PATENT DOCUMENTS

| | | | |
|---|---|---|---|
| 6,344,413 B1* | 2/2002 | Zurcher | H01L 21/3212 257/E21.009 |
| 7,803,688 B2 | 9/2010 | Das et al. | |
| 8,258,010 B2* | 9/2012 | Pagaila | H01L 21/486 438/113 |
| 8,546,188 B2* | 10/2013 | Liu | H01L 25/0657 257/686 |
| 9,190,208 B2 | 11/2015 | Lasiter et al. | |
| 2005/0146403 A1 | 7/2005 | Okubora | |
| 2007/0232014 A1* | 10/2007 | Larsen | H01L 28/40 438/393 |
| 2010/0167424 A1* | 7/2010 | Howard | H01L 22/12 438/5 |
| 2011/0101537 A1* | 5/2011 | Barth | H01L 21/76898 257/774 |
| 2011/0241185 A1* | 10/2011 | Koester | H01L 21/568 257/659 |
| 2011/0298551 A1* | 12/2011 | Yen | H01L 27/016 331/117 FE |
| 2013/0057557 A1 | 3/2013 | Shenoy et al. | |
| 2015/0014812 A1 | 1/2015 | Lan et al. | |
| 2015/0201495 A1 | 7/2015 | Kim et al. | |
| 2015/0340327 A1* | 11/2015 | Uzoh | H01L 24/02 257/723 |

\* cited by examiner

PASSIVE COMPONENTS IMPLEMENTED ON A PLURALITY OF STACKED INSULATORS

INTRODUCTION

Aspects of this disclosure relate generally to wireless communication devices, and more particularly to passive components implemented on a plurality of stacked insulators.

Wireless communication devices conventionally include one or more passive components. The passive components may be analog components that make up a variety of circuits, for example, filters, diplexers, etc. Examples of passive components include capacitors and inductors.

There is a need in the field of wireless communication devices for smaller passive components.

SUMMARY

The following summary is an overview provided solely to aid in the description of various aspects of the disclosure and is provided solely for illustration of the aspects and not limitation thereof.

In one aspect, the present disclosure provides an integrated circuit apparatus. The integrated circuit apparatus may include, for example, a first insulator, the first insulator being substantially planar and having a first top surface and a first bottom surface opposite the first top surface, a first conductor disposed on the first insulator, a second insulator, the second insulator being substantially planar and having a second top surface and a second bottom surface opposite the second top surface, a second conductor disposed on the second insulator, and a dielectric layer disposed between the first bottom conductor of the first insulator and the second top conductor of the second insulator.

In another aspect, the present disclosure provides a method of manufacturing an integrated circuit apparatus. The method may include, for example, patterning and metallizing a first conductor on a first insulator, the first insulator being substantially planar and having a first top surface and a first bottom surface opposite the first top surface, patterning and metallizing a second conductor on a second insulator, the second insulator being substantially planar and having a second top surface and a second bottom surface opposite the second top surface, and stacking the first insulator and the second insulator, such that a dielectric layer is disposed between the first bottom conductor of the first insulator and the second top conductor of the second insulator.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the invention, and in which.

DETAILED DESCRIPTION

Aspects of the disclosure are disclosed in the following description and related drawings directed to specific aspects of the disclosure. Alternate aspects may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the invention" does not require that all aspects of the invention include the discussed feature, advantage or mode of operation.

As used herein, the term "vertical" is generally defined with respect to a surface of a substrate or carrier upon which a semiconductor package is formed. The substrate or carrier will generally define a "horizontal" plane, and a vertical direction approximates a direction that is roughly orthogonal to the horizontal plane.

Figure 1A:
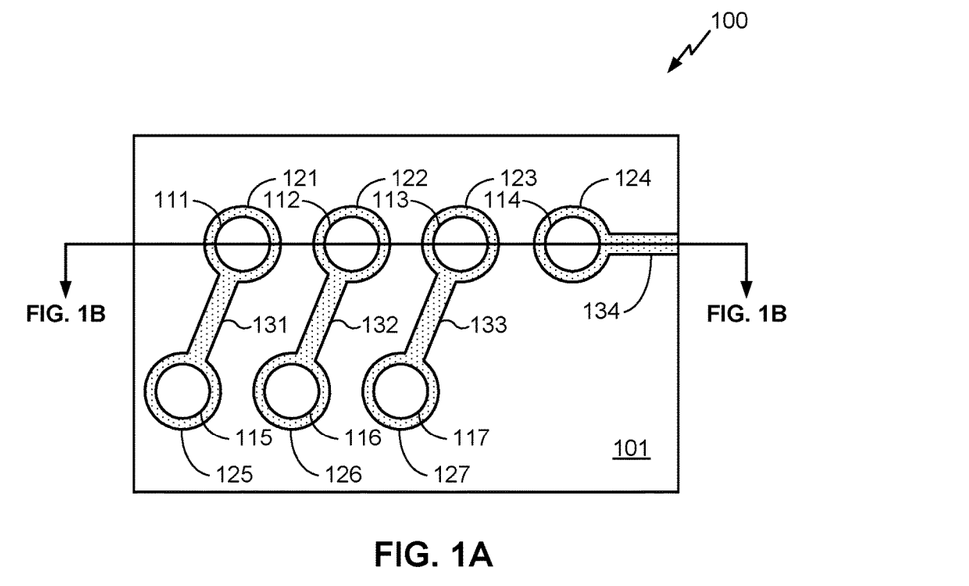
FIG. 1A generally illustrates a top-down view of a plurality of stacked insulators in accordance with an aspect of the disclosure.
Figure 1B:
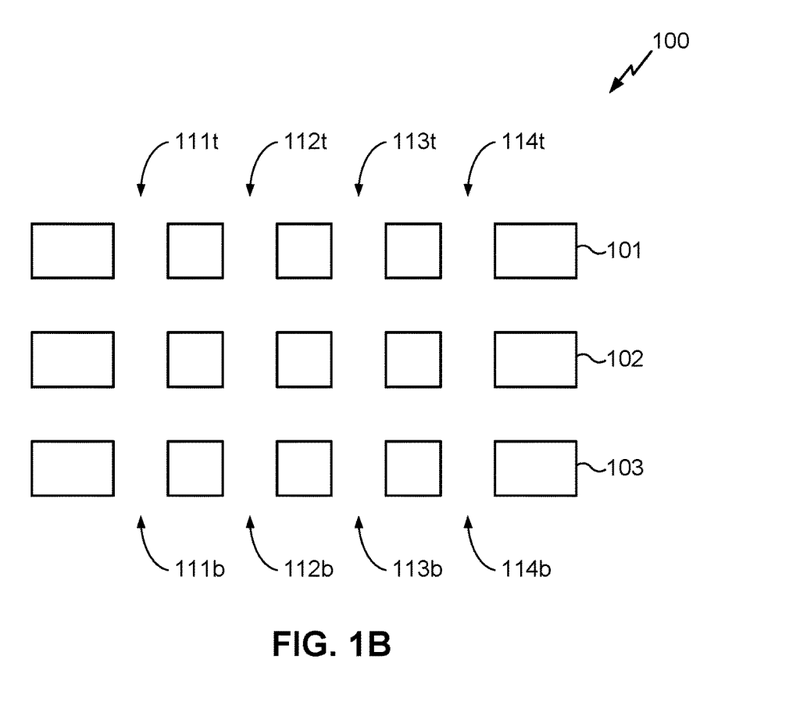
FIG. 1B generally illustrates a side view of the plurality of stacked insulators of FIG. 1A.

FIGS. 1A-1B generally illustrate a plurality of stacked insulators 100 in accordance with an aspect of the disclosure. FIG. 1A generally illustrates a top-down view of the plurality of stacked insulators 100, whereas FIG. 1B generally illustrates a side view. However, it will be understood that the terms "top", "bottom", and "side", as used in the present disclosure, are relative terms used strictly in relation to one another, and do not express or imply any relation with respect to gravity, a manufacturing device used to manufacture the plurality of stacked insulators, or to some other device to which the plurality of stacked insulators 100 are coupled, mounted, etc.

The plurality of stacked insulators 100 may include a top insulator 101, a middle insulator 102, and a bottom insulator 103. Each of the plurality of stacked insulators 100 may include, for example, glass.

The plurality of stacked insulators 100 may include a plurality of vias 111-117, for example, a first via 111, a second via 112, a third via 113, a fourth via 114, a fifth via 115, a sixth via 116, and a seventh via 117. As will be understood from FIG. 1A, the plurality of vias 111-117 may be formed by removing a portion of the top insulator 101. As will be understood from FIG. 1B, analogous portions of the middle insulator 102 and the bottom insulator 103 may also be removed. For example, the top insulator 101, the middle insulator 102, and the bottom insulator 103, or respective portions thereof, may be substantially similar with respect to the location of the plurality of vias 111-117. Then, the plurality of stacked insulators 100 may be aligned such that the plurality of vias 111-117 extend through the entirety of the plurality of stacked insulators 100.

Accordingly, as can be seen from FIG. 1B, each of the plurality of vias 111-117 may include a top and a bottom. For example, the first via 111 may include a first via top 111$t$ and a first via bottom 111$b$. Moreover, the second via 112 may include a second via top 112$t$ and a second via bottom 112$b$. Moreover, the third via 113 may include a third via top 113$t$ and a third via bottom 113$b$. Moreover, the fourth via 114 may include a fourth via top 114$t$ and a fourth via bottom 114$b$.

As can be seen from FIG. 1A, the top surface of the top insulator 101 may include a plurality of via traces 121-127 and a plurality of coupling traces 131-134. The plurality of via traces 121-127 and the plurality of coupling traces 131-134 are not shown in FIG. 1B. The plurality of via traces 121-127 and the plurality of coupling traces 131-134 may be formed of any suitable material, for example, a conductive material such as copper.

The plurality of via traces 121-127 may include a first via trace 121, a second via trace 122, a third via trace 123, a fourth via trace 124, a fifth via trace 125, a sixth via trace 126, and a seventh via trace 127. The plurality of coupling traces 131-134 may include a first coupling trace 131, a second coupling trace 132, a third coupling trace 133, and a fourth coupling trace 134. Each of the via traces 121-127 may be electrically coupled to one or more materials inside one or more of the plurality of vias 111-117, respectively. The one or more materials inside the plurality of vias 111-117 may include, for example, conductive material, dielectric material, semiconductor material, or any other material suitable for manufacturing circuits. Each of the via traces 121-127 may be configured to couple the one or more materials inside the plurality of vias 111-117 to the plurality of coupling traces 131-134. The plurality of coupling traces 131-134 may be configured to electrically couple two or more of the plurality of via traces 121-127.

In the example shown in FIGS. 1A-1B, the plurality of stacked insulators 100 may have an inductor and a capacitor implemented thereon. As will be described in greater detail below, an inductor may be formed in the plurality of stacked insulators 100. For example, the fifth via trace 125 may constitute a first terminal of the inductor and the third via trace 123 may constitute a second terminal of the inductor.

The inductor may be formed in a coil shape extending from the first terminal to the second terminal. For example, the plurality of coupling traces 131-133 may form a top portion of the coil shape. Additional traces (not shown) may be disposed on, for example, the bottom surface of the bottom insulator 103 in order to form a bottom portion of the coil shape. The bottom traces may electrically coupled, for example, the first via 111 to the sixth via 116, the second via 112 to the seventh via 117, and the third via 113 to the fourth via 114.

The first via 111, the second via 112, the third via 113, the sixth via 116, and the seventh via 117 may each include conductive material that couples a top of the via to the bottom (for example, the first via top 111$t$ to the first via bottom 111$b$, the second via top 112$t$ to the second via bottom 112$b$, etc.). As a result, charge may travel along the coil shape from the first terminal (the fifth via trace 125) to the second terminal (the third via trace 123), thereby forming an inductor.

As will be described in greater detail below, a capacitor may also be formed in the plurality of stacked insulators 100. For example, the fourth via trace 124 may constitute a first terminal of the capacitor and the fourth coupling trace 134 may couple the capacitor to some other component or device. As will be described in greater detail below, the capacitor may be formed inside the via 114 by providing suitable materials therein (for example, conductive materials and dielectric materials). For example, a dielectric layer may be formed between the top insulator 101 and the middle insulator 102. Additionally or alternatively, a dielectric layer may be formed between the middle insulator 102 and the bottom insulator 103.

The plurality of stacked insulators 100 may be coupled to one or more processors, one or more memories, or one or more other components of a wireless communication device.

Figure 2A:
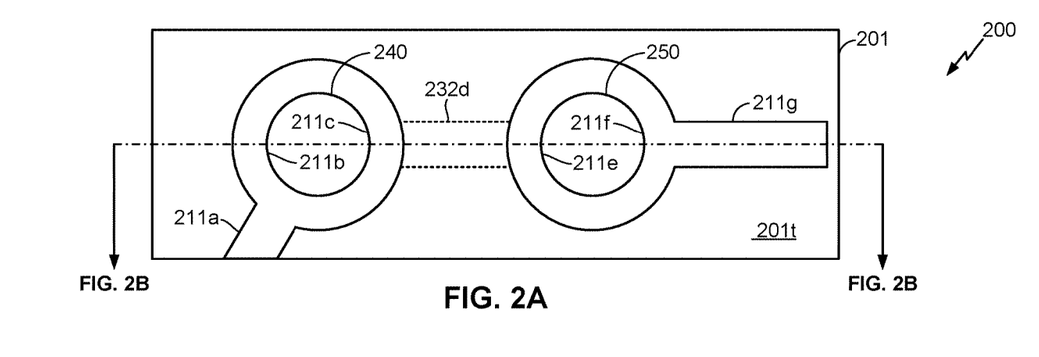
FIG. 2A generally illustrates a top-down view of a plurality of passive component portions implemented within a plurality of stacked insulators in accordance with another aspect of the disclosure.
Figure 2B:
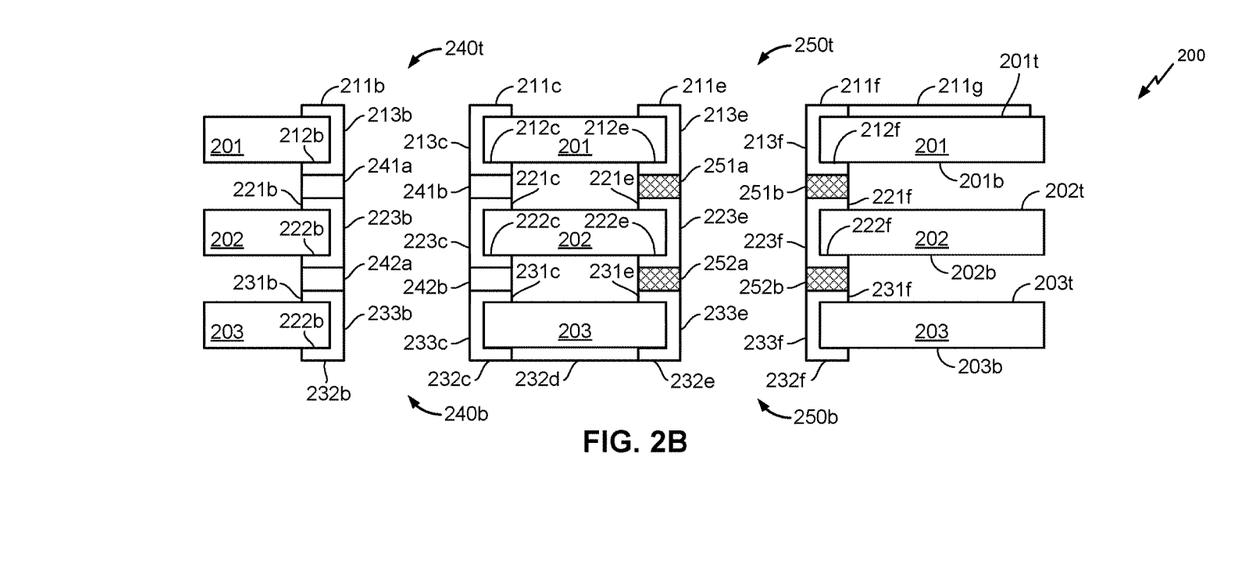
FIG. 2B generally illustrates a side view of the plurality of passive component portions implemented within a plurality of stacked insulators of FIG. 2A.

FIGS. 2A-2B depict a plurality of passive component portions implemented within a plurality of stacked insulators 200 in accordance with another aspect of the disclosure. The plurality of stacked insulators 200 depicted in FIGS. 2A-2B may be analogous in some respects to the plurality of stacked insulators 100 depicted in FIGS. 1A-1B.

For example, the plurality of stacked insulators 200 depicted in FIGS. 2A-2B may include a top insulator 201, a middle insulator 202, and a bottom insulator 203. Each of the plurality of stacked insulators 200 may be substantially planar, such that they each include a top surface, a bottom surface, and a periphery. As noted above, the terms "top", "bottom", and "side", as used in the present disclosure, are relative terms used strictly in relation to one another, and do not express or imply any relation with respect to gravity, a manufacturing device used to manufacture the plurality of stacked insulators, or to some other device to which the plurality of stacked insulators 200 are coupled, mounted, etc. With this in mind, the top insulator 201 may include a top insulator top surface 201$t$ and a top insulator bottom surface 201$b$, the middle insulator 202 may include a middle insulator top surface 202$t$ and a middle insulator bottom surface 202$b$, and the bottom insulator 203 may include a bottom insulator top surface 203$t$ and a bottom insulator bottom surface 203$b$. Although the plurality of stacked insulators 200 depicted in FIGS. 2A-2B includes three insulators, it will be understood that the plurality of stacked insulators 200 may include as few as two insulators. Moreover, the number of insulators in the plurality of stacked insulators 200 is not limited to a maximum of three insulators, but may include any suitable number.

Each of the plurality of stacked insulators 200 may include a plurality of through vias. A first via 240 may extend through each of the plurality of stacked insulators 200 and may have a first via top 240$t$ and a first via bottom 240$b$. The first via 240 may form a portion of an inductor disposed on the plurality of stacked insulators 200.

Moreover, a second via 250 may extend through each of the plurality of stacked insulators 200 and may have a second via top 250$t$ and a second via bottom 250$b$. The second via 250 may have a capacitor or a portion of a capacitor form therein.

As will be understood from FIGS. 2A-2B, the first via 240 and the second via 250 may extend through each of the plurality of stacked insulators 200. The extension of the first via 240 and the second via 250 through each of the plurality of stacked insulators 200 may be facilitated by manufacturing each of the plurality of stacked insulators 200 such that they have substantially identical vias formed therethrough, and then stacking the plurality of stacked insulators 200 such that the substantially identical vias are substantially aligned.

As depicted in FIGS. 2A-2B, a top insulator top conductive layer 211 may be disposed on the top insulator top surface 201t. The top insulator top conductive layer 211 may include a plurality of conductive layer portions, for example, top insulator top conductive layer portions 211a, 211b, 211c, 211e, 211f, and 211g. A top insulator bottom conductive layer 212 may be disposed on the top insulator bottom surface 201b. The top insulator bottom conductive layer 212 may include a plurality of conductive layer portions, for example, top insulator bottom conductive layer portions 212b, 212c, 212e, and 212f. A top insulator sidewall conductive layer 213 may be disposed on a periphery of the top insulator 201. The top insulator sidewall conductive layer 213 may also include a plurality of conductive layer portions, for example, top insulator sidewall conductive layer portions 213b, 213c, 213e, and 213f.

The top insulator sidewall conductive layer portion 213b may electrically couple the top insulator top conductive layer portion 211b to the top insulator bottom conductive layer portion 212b. The top insulator sidewall conductive layer portion 213c may electrically couple the top insulator top conductive layer portion 211c to the top insulator bottom conductive layer portion 212c. The top insulator sidewall conductive layer portion 213e may electrically couple the top insulator top conductive layer portion 211e to the top insulator bottom conductive layer portion 212e. The top insulator sidewall conductive layer portion 213f may electrically couple the top insulator top conductive layer portion 211f to the top insulator bottom conductive layer portion 212f.

As depicted in FIG. 2B, a middle insulator top conductive layer 221 may be disposed on the middle insulator top surface 202t. The middle insulator top conductive layer 221 may include a plurality of conductive layer portions, for example, middle insulator top conductive layer portions 221b, 221c, 221e, and 221f. A middle insulator bottom conductive layer 222 may be disposed on the middle insulator bottom surface 202b. The middle insulator bottom conductive layer 222 may include a plurality of conductive layer portions, for example, middle insulator bottom conductive layer portions 222b, 222c, 222e, and 222f. A middle insulator sidewall conductive layer 223 may be disposed on a periphery of the middle insulator 202. The middle insulator sidewall conductive layer 223 may include a plurality of conductive layer portions, for example, middle insulator sidewall conductive layer portions 223b, 223c, 223e, and 223f.

The middle insulator sidewall conductive layer portion 223b may electrically couple the middle insulator top conductive layer portion 221b to the middle insulator bottom conductive layer portion 222b. The middle insulator sidewall conductive layer portion 223c may electrically couple the middle insulator top conductive layer portion 221c to the middle insulator bottom conductive layer portion 222c. The middle insulator sidewall conductive layer portion 223e may electrically couple the middle insulator top conductive layer portion 221e to the middle insulator bottom conductive layer portion 222e. The middle insulator sidewall conductive layer portion 223f may electrically couple the middle insulator top conductive layer portion 221f to the middle insulator bottom conductive layer portion 222f.

As depicted in FIGS. 2A-2B, a bottom insulator top conductive layer 231 may be disposed on the bottom insulator top surface 203t. The bottom insulator top conductive layer 231 may include a plurality of conductive layer portions, for example, bottom insulator top conductive layer portions 231b, 231c, 231e, and 231f. A bottom insulator bottom conductive layer 232 may be disposed on the bottom insulator bottom surface 203b. The bottom insulator bottom conductive layer 232 may include a plurality of conductive layer portions, for example, bottom insulator bottom conductive layer portions 232b, 232c, 232d, 232e, and 232f. A bottom insulator sidewall conductive layer 233 may be disposed on a periphery of the bottom insulator 203. The bottom insulator sidewall conductive layer 233 may include a plurality of conductive layer portions, for example, bottom insulator sidewall conductive layer portions 233b, 233c, 233e, and 233f.

The bottom insulator sidewall conductive layer portion 233b may electrically couple the bottom insulator top conductive layer portion 231b to the bottom insulator bottom conductive layer portion 232b. The bottom insulator sidewall conductive layer portion 233c may electrically couple the bottom insulator top conductive layer portion 231c to the bottom insulator bottom conductive layer portion 232c. The bottom insulator sidewall conductive layer portion 233e may electrically couple the bottom insulator top conductive layer portion 231e to the bottom insulator bottom conductive layer portion 232e. The bottom insulator sidewall conductive layer portion 233f may electrically couple the bottom insulator top conductive layer portion 231f to the bottom insulator bottom conductive layer portion 232f.

As noted above, the first via 240 may form a portion of an inductor disposed on the plurality of stacked insulators 200. For example, the inductor may have a coil shape and may be formed on and/or within the plurality of stacked insulators 200. As described previously with respect to FIGS. 1A-1B, horizontal portions of the coil may proceed horizontally across one or more surfaces of the plurality of stacked insulators 200, and vertical portions of the coil may proceed vertically through one or more vias analogous to the first via 240.

FIG. 2A depicts an arrangement where the top insulator top conductive layer portion 211a proceeds horizontally across the top insulator top surface 201t of the top insulator 201. Accordingly, the top insulator top conductive layer portion 211a may constitute a horizontal portion of an inductor. FIG. 2A further depicts that the top insulator top conductive layer portion 211a is electrically coupled to the top insulator top conductive layer portions 211b, 211c, which electrically couple the horizontal portion of the inductor to a vertical portion of the inductor.

As noted above, the top insulator top conductive layer portions 211b, 211c are electrically coupled to other conductive layer portions associated with the top insulator 201, in particular, the top insulator bottom conductive layer portions 212b, 212c and the top insulator sidewall conductive layer portions 213b, 213c. Accordingly, these conductive layer portions associated with the top insulator 201 may form a vertical portion of the inductor extending toward the first via bottom 240b of the first via 240.

The vertical portion of the inductor may further include an inter-insulator conductive coupling 241a and/or an inter-insulator conductive coupling 241b, which electrically couple conductive layer portions associated with the top insulator 201 to conductive layer portions associated with the middle insulator 202. Moreover, the vertical portion of the inductor may further include an inter-insulator conductive coupling 242a and/or an inter-insulator conductive coupling 242b, which electrically couple conductive layer portions associated with the middle insulator 202 to conductive layer portions associated with the bottom insulator 203. As will be understood from FIG. 2B, the vertical portion of the inductor may extend through the plurality of stacked insulators 200 to the bottom insulator bottom conductive layer portions 232b, 232c.

The bottom insulator bottom conductive layer portions 232b, 232c may form a terminal of the inductor. For example, as depicted in FIGS. 2A-2B, the terminal of the inductor may be electrically coupled to one or more capacitors provided within the second via 250. The terminal of the inductor may be electrically coupled to the second via 250 by the bottom insulator bottom conductive layer portion 232d depicted in FIGS. 2A-2B. However, it will be understood that the bottom insulator bottom conductive layer portions 232b, 232c may not form a terminal of the inductor, and that the bottom insulator bottom conductive layer portion 232d may instead form another horizontal portion of the inductor (extending horizontally across the bottom insulator bottom surface 203b) and may lead to another vertical portion of the inductor (analogous to the first via 240 having inter-insulator conductive couplings 241a, 241b, 242a, 242b).

As depicted in FIGS. 2A-2B, the second via 250 may include one or more capacitors provided therein. As can be seen from FIG. 2B, a first capacitor may include an inter-insulator dielectric layer 251a and/or an inter-insulator dielectric layer 251b, and a second capacitor may include an inter-insulator dielectric layer 252a and/or an inter-insulator dielectric layer 252b. As will be understood from FIG. 2B, the inter-insulator dielectric layer 251a and/or the inter-insulator dielectric layer 251b may separate conductive layers associated with the top insulator 201 (for example, the top insulator bottom conductive layer portions 212e, 212f) from conductive layers associated with the middle insulator 202 (for example, the middle insulator top conductive layer portions 221e, 221f). Moreover, the inter-insulator dielectric layer 252a and/or the inter-insulator dielectric layer 252b may separate conductive layers associated with the middle insulator 202 (for example, the middle insulator bottom conductive layer portions 222e, 222f) from conductive layers associated with the bottom insulator 203 (for example, the bottom insulator top conductive layer portions 231e, 231f).

The one or more capacitors provided within the second via 250 may extend from the second via top 250t to the second via bottom 250b, and may be electrically coupled to other components by conductive traces on the plurality of stacked insulators 200. As shown in FIGS. 2A-2B, the bottom insulator bottom conductive layer portion 232d may be electrically coupled to the one or more capacitors at the second via bottom 250b, and the top insulator top conductive layer portion 211g may be electrically coupled to the one or more capacitors at the second via top 250t. Although FIG. 2B depicts a plurality of stacked insulators 200 that includes three insulators, wherein two capacitors are provided in series between the three insulators, in will be understood that other arrangements are possible.

Figure 3A:
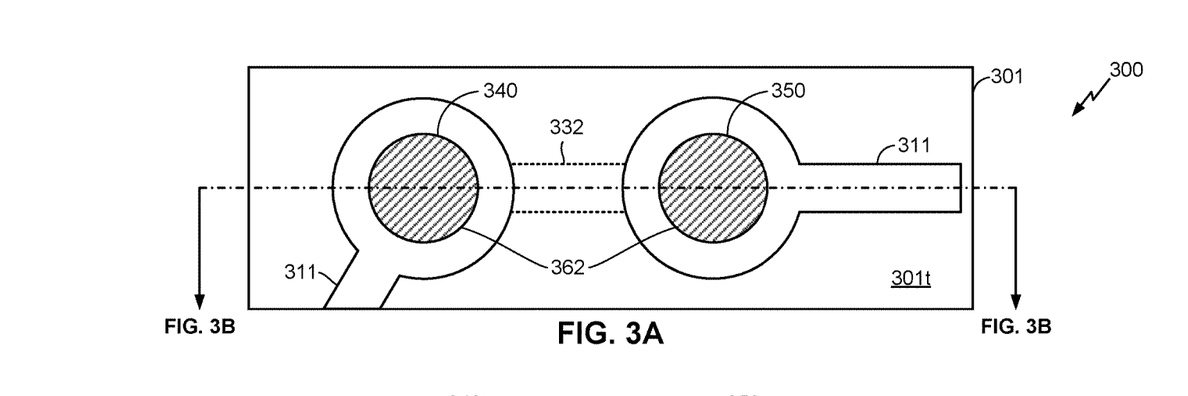
FIG. 3A generally illustrates a top-down view of a plurality of passive component portions implemented within a plurality of stacked insulators in accordance with another aspect of the disclosure.
Figure 3B:
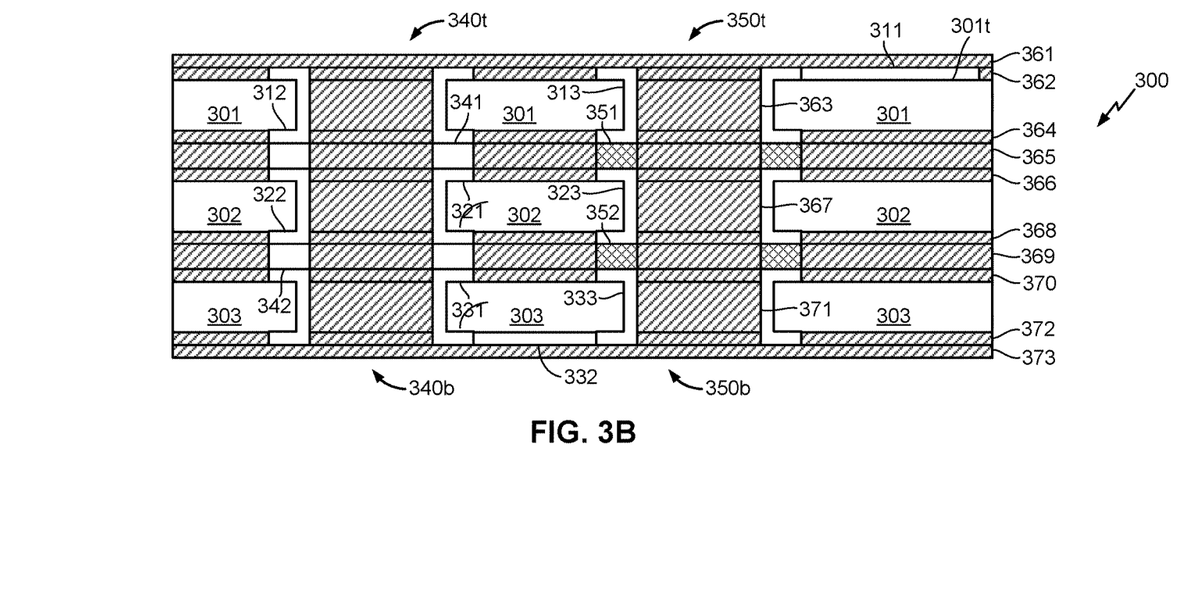
FIG. 3B generally illustrates a side view of the plurality of passive component portions implemented within a plurality of stacked insulators of FIG. 3A.

FIGS. 3A-3B depict a plurality of passive component portions implemented within a plurality of stacked insulators 300 in accordance with another aspect of the disclosure. The plurality of stacked insulators 300 depicted in FIGS. 3A-3B may be analogous in some respects to the plurality of stacked insulators 200 depicted in FIGS. 2A-2B.

For example, the plurality of stacked insulators 300 may include a top insulator 301 similar to the top insulator 201, a middle insulator 302 similar to the middle insulator 202, and a bottom insulator 303 similar to the bottom insulator 203.

As depicted in FIGS. 3A-3B, a plurality of conductive layers may be associated with the top insulator 301. In particular, a top insulator top conductive layer 311 may be similar to the top insulator top conductive layer 211 of FIGS. 2A-2B, a top insulator bottom conductive layer 312 may be similar to the top insulator bottom conductive layer 212 of FIGS. 2A-2B, and a top insulator sidewall conductive layer 313 may be similar to the top insulator sidewall conductive layer 213 of FIGS. 2A-2B. As further depicted in FIGS. 3A-3B, a plurality of conductive layers may be associated with the middle insulator 302. In particular, a middle insulator top conductive layer 321 may be similar to the middle insulator top conductive layer 221 of FIGS. 2A-2B, a middle insulator bottom conductive layer 322 may be similar to the middle insulator bottom conductive layer 222 of FIGS. 2A-2B, and a middle insulator sidewall conductive layer 323 may be similar to the middle insulator sidewall conductive layer 223 of FIGS. 2A-2B. As further depicted in FIGS. 3A-3B, a plurality of conductive layers may be associated with the bottom insulator 303. In particular, a bottom insulator top conductive layer 331 may be similar to the bottom insulator top conductive layer 231 of FIGS. 2A-2B, a bottom insulator bottom conductive layer 332 may be similar to the bottom insulator bottom conductive layer 232 of FIGS. 2A-2B, and a bottom insulator sidewall conductive layer 333 may be similar to the bottom insulator sidewall conductive layer 233 of FIGS. 2A-2B.

Further depicted in FIGS. 3A-3B is a first via 340 having a first via top 340t and a first via bottom 340b. Like the first via 240 depicted in FIGS. 2A-2B, the first via 340 may form a portion of an inductor disposed on the plurality of stacked insulators 300. For example, the inductor may have a coil shape and may be formed on and/or within the plurality of stacked insulators 300. As described previously with respect to FIGS. 1A-1B and FIGS. 2A-2B, horizontal portions of the coil may proceed horizontally across one or more surfaces of the plurality of stacked insulators 300, and vertical portions of the coil may proceed vertically through one or more vias analogous to the first via 340. The vertical portion of the inductor may further include an inter-insulator conductive coupling 341 that electrically couple conductive layer portions associated with the top insulator 301 to conductive layer portions associated with the middle insulator 302. The inter-insulator conductive coupling 341 may be analogous to the inter-insulator conductive couplings 241a, 241b depicted in FIGS. 2A-2B.

Further depicted in FIGS. 3A-3B is a second via 350 having a second via top 350t and a second via bottom 350b. The second via 350 may include one or more capacitors provided therein. For example, a first capacitor included in the second via 350 may include an inter-insulator dielectric layer 351 analogous to the inter-insulator dielectric layer 251a and/or the inter-insulator dielectric layer 251b depicted in FIGS. 2A-2B. A second capacitor included in the second via 350 may include an inter-insulator dielectric layer 352 analogous to the inter-insulator dielectric layer 252a and/or the inter-insulator dielectric layer 252b depicted in FIGS. 2A-2B.

As will be understood from FIGS. 3A-3B, the plurality of stacked insulators 300 may be separated by a plurality of insulative layers. The insulative layers may insulate and/or support the plurality of stacked insulators 300 and/or the elements disposed thereon. The insulative layers may include, for example, laminate. For example, a first insulative layer 361 may be disposed on top of the top insulator top conductive layer 311. A second insulative layer 362 may be disposed on a top surface 301t of the top insulator 301. The second insulative layer 362 may surround the top insulator top conductive layer 311. A third insulative layer 363 may be disposed within the first via 340 and/or the second via 350. A fourth insulative layer 364 may be disposed on a bottom surface 301b of the top insulator 301. The fourth insulative layer 364 may surround the top insulator bottom conductive layer 312.

A fifth insulative layer 365 may be disposed between the top insulator 301 and the middle insulator 302. The fifth insulative layer 365 may surround the inter-insulator conductive coupling 341 and/or the inter-insulator dielectric layer 351. A sixth insulative layer 366 may be disposed on a top surface of the middle insulator 302. The sixth insulative layer 366 may surround the middle insulator top conductive layer 321. A seventh insulative layer 367 may be disposed within the first via 340 and/or the second via 350. An eighth insulative layer 368 may be disposed on a bottom surface of the middle insulator 302. The eighth insulative layer 368 may surround the middle insulator bottom conductive layer 322.

A ninth insulative layer 369 may be disposed between the middle insulator 302 and the bottom insulator 303. The ninth insulative layer 369 may surround the inter-insulator conductive coupling 342 and/or the inter-insulator dielectric layer 352. A tenth insulative layer 370 may be disposed on a top surface of the bottom insulator 303. The tenth insulative layer 370 may surround the bottom insulator top conductive layer 331. An eleventh insulative layer 371 may be disposed within the first via 340 and/or the second via 350. A twelfth insulative layer 372 may be disposed on a bottom surface of the bottom insulator 303. The twelfth insulative layer 372 may surround the bottom insulator bottom conductive layer 332. A thirteenth insulative layer 373 may be disposed on the bottom of the bottom insulator bottom conductive layer 332.

As will be understood from FIGS. 2A-2B and FIGS. 3A-3B, any of the plurality of stacked insulators 200 or the plurality of stacked insulators 300 may constitute a first insulator, the first insulator being substantially planar and having a first top surface and a first bottom surface opposite the first top surface. Moreover, any of the remaining plurality of stacked insulators 200 or any of the remaining plurality of stacked insulators 300 may constitute a second insulator, the second insulator being substantially planar and having a second top surface and a second bottom surface opposite the second top surface. Accordingly, any of the top conductive layers or bottom conductive layers depicted in FIGS. 2A-2B and FIGS. 3A-3B may constitute a first conductor disposed on the first insulator or a second conductor disposed on the second insulator. Moreover, the inter-insulator dielectric layer 251a, the inter-insulator dielectric layer 251b, the inter-insulator dielectric layer 252a, the inter-insulator dielectric layer 252b, the inter-insulator dielectric layer 351, and/or the inter-insulator dielectric layer 352 may constitute a dielectric layer disposed between the first bottom conductor of the first insulator and the second top conductor of the second insulator.

It will be further understood that a capacitor may be formed by the first conductor disposed on the first insulator, the dielectric layer, and the second conductor disposed on the second insulator. Accordingly, the second via 250 and the second via 350 may be referred to as capacitor vias. As depicted in FIGS. 2A-2B and FIGS. 3A-3B, the first insulator and the second insulator may have respective vias provided therethrough, and may be vertically stacked such that the respective vias, for example, the capacitor vias, are vertically aligned.

The first conductor may be a first bottom conductor disposed on a first bottom surface of the first insulator (such as, for example, the top insulator bottom conductive layer portion 212f or a similarly-situated element) and the second conductor may be a second top conductor disposed on the second top surface of the second insulator (such as, for example, the middle insulator top conductive layer portion 221f or a similarly-situated element). Moreover, a first top conductor may be disposed on the first top surface of the first insulator (such as, for example, the top insulator top conductive layer portion 211f or a similarly-situated element) and a first conductive sidewall (such as, for example, top insulator sidewall conductive layer portion 213f or a similarly-situated element) may be disposed within a first insulator via of the respective vias (such as, for example, the second via 250 or the second via 350) The first conductive sidewall electrically couples the first top conductor to the first bottom conductor. Moreover, a second top conductor may be disposed on the second top surface of the second insulator (such as, for example, the middle insulator top conductive layer portion 221f or a similarly-situated element) and a second conductive sidewall (such as, for example, middle insulator sidewall conductive layer portion 223f or a similarly-situated element) may be disposed within a second insulator via of the respective vias (such as, for example, the second via 250 or the second via 350). The second conductive sidewall electrically couples the second top conductor to the second bottom conductor.

As will be understood from FIGS. 2A-2B and FIGS. 3A-3B, the aforementioned elements may be electrically coupled. For example, the first top conductor disposed on the first top surface of the first insulator may be electrically coupled to the first conductive sidewall disposed within the first insulator via, the first conductive sidewall may be electrically coupled to the first bottom conductor disposed on the first bottom surface of the first insulator, the first bottom conductor may be electrically coupled to the dielectric layer, the dielectric layer may be electrically coupled to the second top conductor disposed on the second insulator, the second top conductor may be electrically coupled to the second conductive sidewall disposed within the second insulator via, and the second conductive sidewall may be electrically coupled to the second bottom conductor disposed on the second bottom surface of the second insulator.

An inductor may also be formed on the first insulator and the second insulator, such that an inductor-capacitor circuit is formed on, or within, the plurality of stacked insulators 200 or the plurality of stacked insulators 300. The inductor may include horizontal coil portions and vertical coil portions. The horizontal coil portions may include a plurality of parallel conductive portions (analogous to, for example, the plurality of coupling traces 131-133 depicted in FIG. 1A) formed on one or more of the first top surface and the first bottom surface of the first insulator electrically coupling two inductor vias in the first insulator and a plurality of parallel conductive portions (analogous to, for example, the plurality of coupling traces 131-133 depicted in FIG. 1A) formed on one or more of the second top surface and the second bottom surface of the second insulator electrically coupling two inductor vias in the second insulator. The inductor vias may be analogous to, for example, one or more of the vias 111-117 depicted in FIG. 1A, the first via 240 depicted in FIGS. 2A-2B, and the first via 340 depicted in FIGS. 3A-3B. The vertical coil portions may include conductive sidewalls within the two inductor vias in the first insulator and the two inductor vias in the second insulator (such as, for example, top insulator sidewall conductive layer 313 or a similarly-situated element) and a conductive coupling disposed between the first insulator and the second insulator (such as, for example, the inter-insulator conductive coupling 341 or a similarly-situated element).

As will be understood from FIGS. 3A-3B, any of the insulative layers 362, 364, 366, 368, 370, 372 may be disposed on portions of the first insulator and the second insulator upon which the first conductor and second conductor are not disposed.

Figure 4:
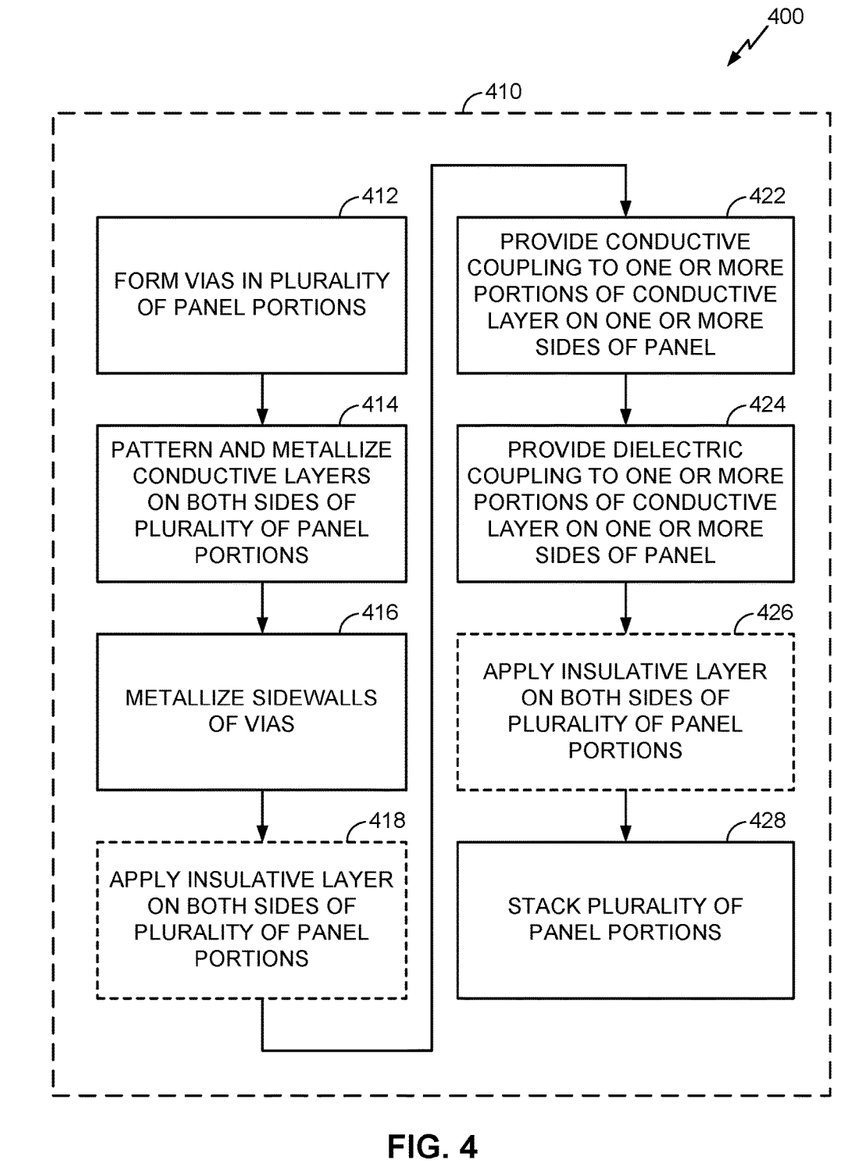
FIG. 4 is a flow diagram generally illustrating a method for manufacturing one or more passive components using a plurality of insulators in accordance with yet another aspect of the disclosure.

FIG. 4 is a flow diagram generally illustrating a method 400 for manufacturing one or more passive components using a plurality of insulators in accordance with yet another aspect of the disclosure. The one or more passive components may include one or more inductors and/or one or more capacitors. The one or more passive components (or portions thereof) may be provided on or within one or more vias in the plurality of insulators. The plurality of insulators may be analogous to the plurality of stacked insulators 200 depicted in FIGS. 2A-2B and/or the plurality of stacked insulators 300 depicted in FIGS. 3A-3B. The one or more vias may be analogous to the first via 240 and/or the second via 250 depicted in FIGS. 2A-2B and/or the first via 340 and/or the second via 350 depicted in FIGS. 3A-3B. The method 400 will be described as it would be performed to manufacture the one or more passive components (or portions thereof) depicted in FIGS. 3A-3B.

A first portion 410 of the method 400 may be performed on a panel. The first portion 410 may be performed as a double-sided passive-on-glass (PoG) process.

At 412, the method 400 forms vias in a plurality of panel portions. The panel may include one or more sheets of insulator, for example, sheets of glass. The panel portions may be analogous to, for example, the top insulator 301, the middle insulator 302, and the bottom insulator 303 depicted in FIGS. 3A-3B. The vias may be analogous to, for example, the first via 340 and/or the second via 350 depicted in FIGS. 3A-3B. In some implementations, a single sheet of insulator may include each of the plurality of panel portions. In other implementations, each of the plurality of panel portions is formed on a different insulator sheet.

It will be understood that the plurality of panel portions may include a first insulator and a second insulator, and that the forming at 412 may include forming respective vias through the first insulator and the second insulator.

At 414, the method 400 patterns and metallizes conductive layers on both sides of the plurality of panel portions. The conductive layers patterned and metallized at 412 may be analogous to the top insulator top conductive layer 311, the top insulator bottom conductive layer 312, the middle insulator top conductive layer 321, the middle insulator bottom conductive layer 322, the bottom insulator top conductive layer 331, and the bottom insulator bottom conductive layer 332 depicted in FIGS. 3A-3B.

It will be understood that the patterning and metallizing at 414 may include patterning and metallizing a first conductor on the first insulator and patterning and metallizing a second conductor on the second insulator.

It will be further understood that the patterning and metallizing of the first conductor may include patterning and metallizing a first top conductor on the first top surface of the first insulator, patterning and metallizing a first bottom conductor disposed on the first bottom surface of the first insulator, and metallizing a first conductive sidewall within a first insulator via of the respective vias, wherein the first conductive sidewall electrically couples the first top conductor to the first bottom conductor. The patterning and metallizing of the first conductor may further include electrically coupling the first top conductor to the first conductive sidewall and electrically coupling the first conductive sidewall to the first bottom conductor disposed on the first bottom surface of the first insulator.

It will be further understood that the patterning and metallizing of the second conductor may include patterning and metallizing a second top conductor on the second top surface of the second insulator, patterning and metallizing a second bottom conductor disposed on the second bottom surface of the second insulator, and metallizing a second conductive sidewall within a second insulator via of the respective vias, wherein the second conductive sidewall electrically couples the second top conductor to the second bottom conductor. The patterning and metallizing of the second conductor may further include electrically coupling the second top conductor to the second conductive sidewall and electrically coupling the second conductive sidewall to the second bottom conductor disposed on the second bottom surface of the second insulator.

It will be further understood that the patterning and metallizing at 414 may include forming horizontal coil portions and forming vertical coil portions of an inductor. For example, the forming of the horizontal coil portions may include patterning and metallizing a first plurality of parallel conductive portions on one or more of the first top surface and the first bottom surface of the first insulator and patterning and metallizing a second plurality of parallel conductive portions formed on one or more of the second top surface and the second bottom surface of the second insulator. The first plurality of parallel conductive portions may electrically couple two inductor vias in the first insulator and the second plurality of parallel conductive portions may electrically couple two second inductor vias in the second insulator. The forming of the vertical coil portions may include metallizing conductive sidewalls within the two first inductor vias in the first insulator and the two second inductor vias in the second insulator.

At 416, the method 400 metallizes the sidewalls of the vias formed at 414. The conductive sidewalls formed at 414 may be analogous to the top insulator sidewall conductive layer 313, the middle insulator sidewall conductive layer 323 and/or the bottom insulator sidewall conductive layer 333 depicted in FIGS. 3A-3B.

At 418, the method 400 optionally applies an insulative layer on both sides of the plurality of panel portions. The insulative layer may include, for example, laminate. The insulative layer may surround the conductive layers patterned and metallized at 414. The insulative layer may be analogous to, for example, one or more of the second insulative layer 362, the third insulative layer 363, the fourth insulative layer 364, the sixth insulative layer 366, the seventh insulative layer 367, the eighth insulative layer 368, the tenth insulative layer 370, the eleventh insulative layer 371, and/or the twelfth insulative layer 372.

In some implementations, the insulative layer applied at 418 fills at least a portion of the vias formed at 412, similar to, for example, the third insulative layer 363, the seventh insulative layer 367, and/or the eleventh insulative layer 371 depicted in FIG. 3B. In some implementations, the insulative layer is applied at a same height as the conductive layer patterned and metallized at 414. Moreover, the conductive layer patterned and metallized at 414 is not embedded in the insulative layer applied at 418, but is instead exposed and configured for electrical coupling.

At 422, the method 400 provides a conductive coupling to one or more portions of the conductive layer on one or more sides of the plurality of panel portions. The inter-insulator conductive coupling may be analogous to, for example, the inter-insulator conductive coupling 341 and the inter-insulator conductive coupling 342 depicted in FIG. 3.

At 424, the method 400 provides a dielectric coupling to one or more portions of the conductive layer on one or more sides of the plurality of panel portions. The inter-insulator dielectric coupling may be analogous to, for example, the inter-insulator dielectric coupling 351 and the inter-insulator dielectric coupling 352 depicted in FIG. 3B.

At 426, the method 400 optionally applies an insulative layer on both sides of the plurality of panel portions. The insulative layer may be analogous to, for example, one or more of the first insulative layer 361, the fifth insulative layer 365, the ninth insulative layer 369, and/or the thirteenth insulative layer 373. In some implementations, the insulative layer is applied at a same height as the inter-insulator conductive coupling provided at 422 and/or the inter-insulator dielectric coupling applied at 424. Moreover, the inter-insulator conductive coupling provided at 422 and/or the inter-insulator dielectric coupling applied at 424 are not embedded in the insulative layer applied at 426, but are instead exposed and configured for electrical coupling.

It will be understood that the applying at 426 may include applying an insulative layer to portions of the first insulator and the second insulator upon which the first conductor and second conductor are not disposed.

At 428, the method 400 stacks the plurality of panel portions. The stacking at 428 may be performed such that the vias formed at 412 in a particular panel portion of the plurality of panel portions is aligned with one or more vias formed at 412 in one or more adjacent panel portions of the plurality of panel portions. The stacking at 428 may be performed such that one or more of the conductive couplings provided to a particular panel portion at 422 and/or one or more of the dielectric couplings provided to the particular panel portion at 424 are coupled to one or more portions of the conductive layer patterned and metallized on an adjacent panel portion of the plurality of panel portions.

It will be understood that the stacking at 428 may include forming a capacitor from the first conductor disposed on the first insulator, the dielectric layer, and the second conductor disposed on the second insulator. Additionally or alternatively, the stacking at 428 may include forming an inductor on and/or within the first insulator and the second insulator, for example, by providing a conductive coupling between the first insulator and the second insulator.

Moreover, the stacking at 428 may include vertically stacking the first insulator and the second insulator such that the respective vias, for example, the vias formed at 412, are vertically aligned. The stacking at 428 may further include electrically coupling the first bottom conductor to the dielectric layer and electrically coupling the dielectric layer to the second top conductor disposed on the second insulator.

As noted above, in some implementations, a single sheet of insulator may include each of the plurality of panel portions. Accordingly, the plurality of panel portions may optionally be singulated prior to the stacking at 428.

Figure 5:
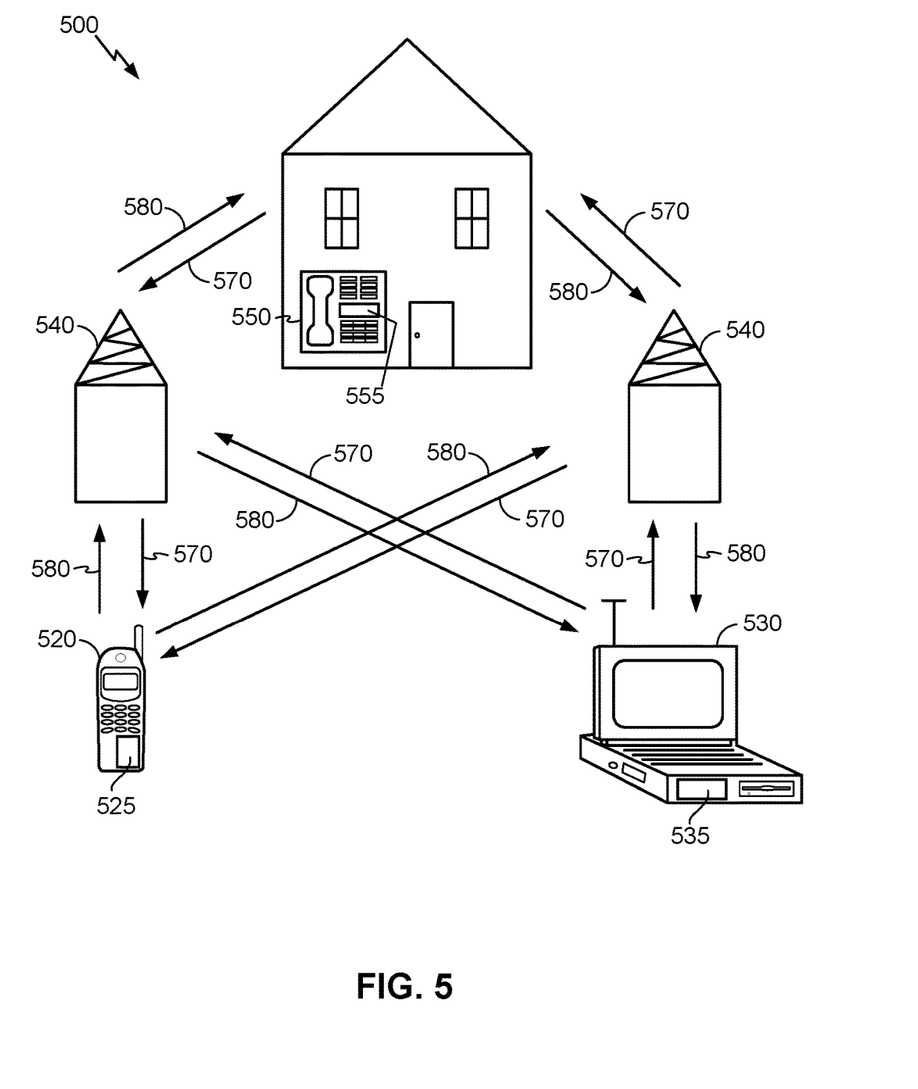
FIG. 5 generally illustrates a block diagram showing an exemplary wireless communication system in which an aspect of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525, 535 and 555, as disclosed below. It will be recognized that any device containing an IC may also include semiconductor components having the disclosed features and/or components manufactured by the processes disclosed here, including the base stations, switching devices, and network equipment. FIG. 5 shows forward link signals 580 from the base station 540 to the remote units 520, 530, and 550 and reverse link signals 570 from the remote units 520, 530, and 550 to base stations 540.

In FIG. 5, the remote unit 520 is shown as a mobile telephone, the remote unit 530 is shown as a portable computer, and the remote unit 550 is shown as a fixed location remote unit in a wireless local loop system. For example, remote units may be a device such as a music player, a video player, an entertainment unit, a navigation device, a communications device, a personal digital assistant (PDA), a fixed location data unit, and a computer. Although FIG. 5 illustrates remote units according to the teachings of the disclosure, the disclosure is not limited to these exemplary illustrated units. The disclosure may be suitably employed in any device which includes semiconductor components, as described below.

The multiplexers disclosed herein may be included in a device such as a set top box, a music player, a video player, an entertainment unit, a navigation device, a communications device, a personal digital assistant (PDA), a fixed location data unit, or a computer.

Figure 6:
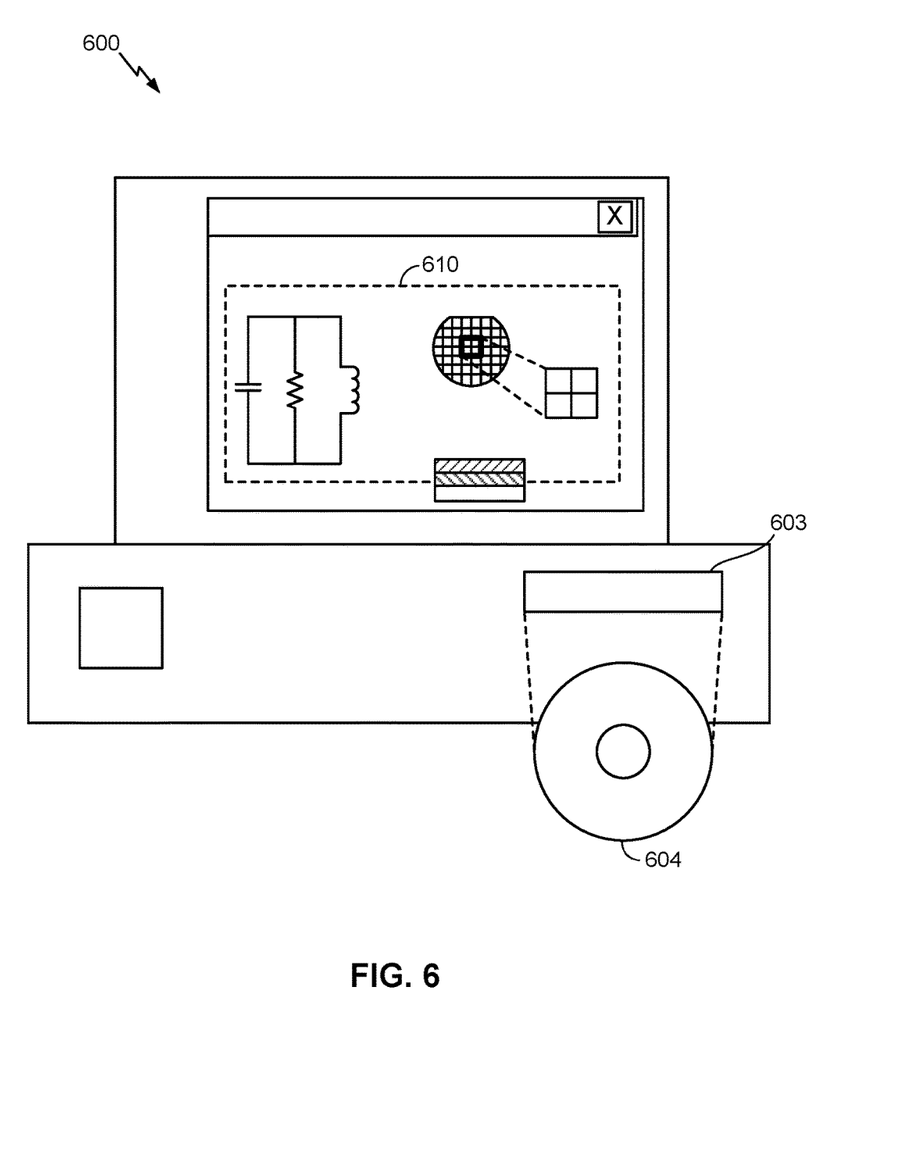
FIG. 6 generally illustrates a block diagram illustrating a design workstation used for circuit, layout, and logic design of the disclosed semiconductor IC package.

FIG. 6 is a block diagram illustrating a design workstation for circuit, layout, and design of a semiconductor part as disclosed herein. A design workstation 600 may include a hard disk containing operating system software, support files, and design software such as Cadence or OrCAD. The design workstation 600 also includes a display to facilitate design of a semiconductor part 610 that may include a circuit and semiconductor dies. A storage medium 604 is provided for tangibly storing the semiconductor part 610. The semiconductor part 610 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. Providing data on the storage medium 604 facilitates the design of the semiconductor part 610 by decreasing the number of processes for designing circuits and semiconductor dies.

The foregoing description may have references to discrete elements or properties, such as a capacitor, capacitive, a resistor, resistive, an inductor, inductive, conductor, conductive and the like. However, it will be appreciated that the various aspects disclosed herein are not limited to specific elements and that various components, elements or portions of components or elements may be used to achieve the functionality of one or more discrete elements or properties. For example, a capacitive component or capacitive element may be a discrete device or may be formed by a specific arrangement of conductive traces separated by a dielectric material or combinations thereof. Likewise, an inductive component or inductive element may be a discrete device or may be formed by a specific arrangement of conductive traces and materials (e.g., air core, magnetic, paramagnetic, etc.) or combinations thereof. Similarly, a resistive component or resistive element may be a discrete device or may be formed by a semiconductor material, insulating material, adjusting the length and/or cross-sectional area of conductive traces, or combinations thereof. Moreover, a specific arrangement of conductive traces and materials may provide one or more resistive, capacitive or inductive functions. Accordingly, it will be appreciated that the various components or elements disclosed herein are not limited to the specific aspects and or arrangements detailed, which are provided merely as illustrative examples.

While the foregoing disclosure shows illustrative aspects of the disclosure, it should be noted that various changes and modifications could be made herein without departing from the scope of the invention as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit apparatus, comprising:
   a first insulator, the first insulator being substantially planar and having a first top surface and a first bottom surface opposite the first top surface;
   a first conductor disposed on the first insulator;
   a second insulator, the second insulator being substantially planar and having a second top surface and a second bottom surface opposite the second top surface;
   a second conductor disposed on the second insulator; and
   a dielectric layer disposed between the first conductor of the first insulator and the second conductor of the second insulator;
   wherein:
      a capacitor is formed by the first conductor disposed on the first insulator, the dielectric layer, and the second conductor disposed on the second insulator; and
      an inductor is formed on the first insulator and the second insulator.

2. The integrated circuit apparatus of claim 1, wherein the first insulator and the second insulator include respective vias provided therethrough.

3. The integrated circuit apparatus of claim 2, wherein the first insulator and the second insulator are vertically stacked such that the respective vias are vertically aligned.

4. The integrated circuit apparatus of claim 2, wherein the first conductor is a first bottom conductor disposed on the first bottom surface of the first insulator;
   the integrated circuit apparatus further comprising:
      a first top conductor disposed on the first top surface of the first insulator; and
      a first conductive sidewall disposed within a first insulator via of the respective vias, wherein the first conductive sidewall electrically couples the first top conductor to the first bottom conductor.

5. The integrated circuit apparatus of claim 4, wherein the second conductor is a second top conductor disposed on the second top surface of the second insulator;
   the integrated circuit apparatus further comprising:
      a second bottom conductor disposed on the second bottom surface of the second insulator; and
      a second conductive sidewall disposed within a second insulator via of the respective vias, wherein the second conductive sidewall electrically couples the second top conductor to the second bottom conductor.

6. The integrated circuit apparatus of claim 5, wherein:
   the first top conductor disposed on the first top surface of the first insulator is electrically coupled to the first conductive sidewall disposed within the first insulator via;
   the first conductive sidewall is electrically coupled to the first bottom conductor disposed on the first bottom surface of the first insulator;
   the first bottom conductor is electrically coupled to the dielectric layer;
   the dielectric layer is electrically coupled to the second top conductor disposed on the second insulator;
   the second top conductor is electrically coupled to the second conductive sidewall disposed within the second insulator via; and
   the second conductive sidewall is electrically coupled to the second bottom conductor disposed on the second bottom surface of the second insulator.

7. The integrated circuit apparatus of claim 1, wherein:
   the integrated circuit apparatus forms an inductor-capacitor circuit.

8. The integrated circuit apparatus of claim 1, wherein the inductor includes horizontal coil portions and vertical coil portions,
   the horizontal coil portions including:
      a first plurality of parallel conductive portions formed on one or more of the first top surface and the first bottom surface of the first insulator and electrically coupling two first inductor vias in the first insulator; and
      a second plurality of parallel conductive portions formed on one or more of the second top surface and the second bottom surface of the second insulator and electrically coupling two second inductor vias in the second insulator; and
   the vertical coil portions including:
      conductive sidewalls within the two first inductor vias in the first insulator and the two second inductor vias in the second insulator; and
      a conductive coupling disposed between the first insulator and the second insulator.

9. The integrated circuit apparatus of claim 1, wherein an insulative layer is disposed on portions of the first insulator and the second insulator upon which the first conductor and the second conductor are not disposed.

10. A method of manufacturing an integrated circuit apparatus, the method comprising:
    patterning and metallizing a first conductor on a first insulator, the first insulator being substantially planar and having a first top surface and a first bottom surface opposite the first top surface;
    patterning and metallizing a second conductor on a second insulator, the second insulator being substantially planar and having a second top surface and a second bottom surface opposite the second top surface; and
    stacking the first insulator and the second insulator, such that a dielectric layer is disposed between the first conductor of the first insulator and the second conductor of the second insulator;
    wherein stacking the first insulator and the second insulator comprises:
       forming a capacitor from the first conductor disposed on the first insulator, the dielectric layer, and the second conductor disposed on the second insulator;

forming an inductor on the first insulator and the second insulator.

11. The method of claim 10, further comprising forming respective vias through the first insulator and the second insulator.

12. The method of claim 11, wherein the stacking of the first insulator and the second insulator includes vertically stacking the first insulator and the second insulator such that the respective vias are vertically aligned.

13. The method of claim 11, wherein the patterning and metallizing of the first conductor includes:
   patterning and metallizing a first top conductor on the first top surface of the first insulator;
   patterning and metallizing a first bottom conductor disposed on the first bottom surface of the first insulator; and
   metallizing a first conductive sidewall within a first insulator via of the respective vias, wherein the first conductive sidewall electrically couples the first top conductor to the first bottom conductor.

14. The method of claim 13, wherein the patterning and metallizing of the second conductor includes:
   patterning and metallizing a second top conductor on the second top surface of the second insulator;
   patterning and metallizing a second bottom conductor disposed on the second bottom surface of the second insulator; and
   metallizing a second conductive sidewall within a second insulator via of the respective vias, wherein the second conductive sidewall electrically couples the second top conductor to the second bottom conductor.

15. The method of claim 14, wherein:
   the patterning and metallizing of the first conductor further includes:
      electrically coupling the first top conductor to the first conductive sidewall; and
      electrically coupling the first conductive sidewall to the first bottom conductor disposed on the first bottom surface of the first insulator; and
   the patterning and metallizing of the second conductor further includes:
      electrically coupling the second top conductor to the second conductive sidewall; and
      electrically coupling the second conductive sidewall to the second bottom conductor disposed on the second bottom surface of the second insulator; and
   the stacking of the first insulator and the second insulator further includes:
      electrically coupling the first bottom conductor to the dielectric layer; and
      electrically coupling the dielectric layer to the second top conductor disposed on the second insulator.

16. The method of claim 10, wherein stacking the first insulator and the second insulator further comprises:
   forming an inductor-capacitor circuit from the integrated circuit apparatus.

17. The method of claim 10, wherein the forming of the inductor includes the forming of horizontal coil portions and the forming of vertical coil portions, wherein
   forming the horizontal coil portions includes:
      patterning and metallizing a first plurality of parallel conductive portions on one or more of the first top surface and the first bottom surface of the first insulator, the first plurality of parallel conductive portions electrically coupling two first inductor vias in the first insulator; and
      patterning and metallizing a second plurality of parallel conductive portions formed on one or more of the second top surface and the second bottom surface of the second insulator, the second plurality of parallel conductive portions electrically coupling two second inductor vias in the second insulator; and
   forming the vertical coil portions includes:
      metallizing conductive sidewalls within the two first inductor vias in the first insulator and the two second inductor vias in the second insulator; and
      providing a conductive coupling between the first insulator and the second insulator.

18. The method of claim 10, further comprising applying an insulative layer to portions of the first insulator and the second insulator upon which the first conductor and the second conductor are not disposed.

* * * * *